(12) United States Patent
Zhang

(10) Patent No.: US 12,414,414 B2
(45) Date of Patent: Sep. 9, 2025

(54) DISPLAY PANEL AND DISPLAY DEVICE

(71) Applicants: Huizhou China Star Optoelectronics Display Co., Ltd., Guangdong (CN); Shenzhen China Star Optoelectronics Semiconductor Display Technology Co., Ltd., Guangdong (CN)

(72) Inventor: Liang Zhang, Guangdong (CN)

(73) Assignees: Huizhou China Star Optoelectronics Display Co., Ltd., Huizhou (CN); Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 325 days.

(21) Appl. No.: 17/898,508

(22) Filed: Aug. 30, 2022

(65) Prior Publication Data

US 2024/0047627 A1    Feb. 8, 2024

(30) Foreign Application Priority Data

Aug. 2, 2022    (CN) .......................... 202210921056.5

(51) Int. Cl.
*H10H 20/851*    (2025.01)
*H10H 29/14*    (2025.01)

(52) U.S. Cl.
CPC ...... *H10H 20/8514* (2025.01); *H10H 29/142* (2025.01)

(58) Field of Classification Search
None
See application file for complete search history.

(56) References Cited

U.S. PATENT DOCUMENTS

2021/0033907 A1    2/2021    Yin
2021/0273142 A1    9/2021    Kang et al.
(Continued)

FOREIGN PATENT DOCUMENTS

CN    108776414    11/2018
CN    110456577    11/2019
(Continued)

OTHER PUBLICATIONS

Machine-generated English translation of JP2008235075 (Year: 2008).*
(Continued)

*Primary Examiner* — Bo B Jang

(57) ABSTRACT

A display panel and a display device are provided. The display panel includes a substrate and a color conversion layer. The substrate includes a first side surface and a second side surface disposed opposite to each other. A plurality of light-emitting areas are arranged in parallel on the first side surface, and a first positioning structure is disposed on the first side surface and is spaced apart from the light-emitting areas. A color conversion layer is disposed opposite to the first side surface of the substrate and includes a plurality of color conversion areas arranged in parallel and disposed corresponding to the light-emitting areas. A second positioning structure is disposed on a side of the color conversion layer facing the first side surface and arranged corresponding to the first positioning structure. The second positioning structure is connected to the first positioning structure.

11 Claims, 4 Drawing Sheets

(56) References Cited

U.S. PATENT DOCUMENTS

2021/0399181 A9 * 12/2021 Kang .................... G06F 3/0414
2022/0190200 A1    6/2022 Yu

FOREIGN PATENT DOCUMENTS

CN       113488501       10/2021
CN       114000589        4/2022
JP       2008235075     * 10/2008

OTHER PUBLICATIONS

Notification of Office Action and Search Report Dated Jan. 25, 2025 From The State Intellectual Property Office of the People's Republic of China Re. Application No. 202210921056.5 and Its Translation Into English. (16 Pages).
Notification of Office Action and Search Report Dated Jul. 29, 2025 From The State Intellectual Property Office of the People's Republic of China Re. Application No. 202210921056.5 and Its Translation Into English. (15 Pages).

* cited by examiner

DISPLAY PANEL AND DISPLAY DEVICE

RELATED APPLICATIONS

This application claims the benefit of priority of Chinese Patent Application No. 202210921056.5, filed Aug. 2, 2022, the contents of which are incorporated by reference as if fully set forth herein in their entirety.

BACKGROUND OF INVENTION

1. Field of Invention

The present application relates to a technical field of displays, and particularly to a display panel and a display device.

2. Related Art

With development of display technologies, quantum dot technologies are gradually favored by people. In display panels using quantum dot technologies, different color conversion areas on color conversion layers are coated with quantum dots of different colors, and then the color conversion layers are attached to backlight substrates, so that the quantum dots in the color conversion areas correspond to light-emitting areas on the backlight substrates, so as to achieve the display of the display panels. However, conventional color conversion layers and substrates are prone to displacement and misalignment during production or use, resulting in optical crosstalk between adjacent light-emitting areas, and adversely affecting display effects of display panels.

SUMMARY OF INVENTION

Embodiments of the present application provide a display panel and a display device to overcome a problem that color conversion layers and substrates in conventional display panels are prone to displacement and misalignment, resulting in optical crosstalk.

An embodiment of the present application provides a display panel, including a substrate comprising a first side surface and a second side surface disposed opposite to each other. A plurality of light-emitting areas are arranged in parallel on the first side surface, a first positioning structure is disposed on the first side surface and is spaced apart from the light-emitting areas, and a color conversion layer disposed opposite to the first side surface of the substrate and comprising a plurality of color conversion areas arranged in parallel and disposed corresponding to the light-emitting areas. A second positioning structure is disposed on a side of the color conversion layer facing the first side surface and arranged corresponding to the first positioning structure, and the second positioning structure is connected to the first positioning structure.

Optionally, in some embodiments of the present application, the first positioning structure is protruded on the first side surface, the second positioning structure is protruded on the side of the color conversion layer facing the first side surface, and a side of the first positioning structure facing the second positioning structure is connected to a side of the second positioning structure facing the first positioning structure.

Optionally, in some embodiments of the present application, a first positioning hole is located on the side of the first positioning structure facing the second positioning structure, and the second positioning structure is inserted into the first positioning hole, so that the second positioning structure is connected to the first positioning structure; and/or, a second positioning hole is located on the side of the second positioning structure facing the first positioning structure, and the first positioning structure is inserted into the second positioning hole, so that the first positioning structure is connected to the second positioning structure.

Optionally, in some embodiments of the present application, the first side surface of the substrate is partially recessed for formation of the first positioning structure, and the second positioning structure is protruded on the side of the color conversion layer facing the first side surface and is inserted into the first positioning structure, so that the second positioning structure is connected to the first positioning structure; or the side of the color conversion layer facing the first side surface is recessed for formation of the second positioning structure, and the first positioning structure is protruded on the first side surface and is inserted into the second positioning structure, so that the first positioning structure is connected to the second positioning structure.

Optionally, in some embodiments of the present application, the first positioning structure is located between adjacent ones of the light-emitting areas, and the second positioning structure is located between adjacent ones of the color conversion areas.

Optionally, in some embodiments of the present application, there are first positioning structures and second positioning structures connected to the first positioning structures in a one-to-one correspondence.

Optionally, in some embodiments of the present application, each of the first positioning structure and the second positioning structure is made of a thermoplastic material.

Optionally, in some embodiments of the present application, each of the first positioning structure and the second positioning structure is made of a material comprising a magnetic material, and the side of the first positioning structure facing the second positioning structure and the side of the second positioning structure facing the first positioning structure magnetically attract each other.

Optionally, in some embodiments of the present application, each of the first positioning structure and the second positioning structure is made of a material comprising a light-shielding material, there are first positioning structures arranged around a corresponding one of the light-emitting areas, and there are second positioning structures arranged around a corresponding one of the color conversion areas.

Correspondingly, an embodiment of the present application further provides a display device including any one of the above-mentioned display panels, a casing connected to the display panel, and a control circuit disposed in the casing and electrically connected to the display panel.

In the embodiment of the present application, the display panel includes the substrate and the color conversion layer. The substrate includes the first side surface and the second side surface disposed opposite to each other. The light-emitting areas are arranged in parallel on the first side surface, and the first positioning structure is disposed on the first side surface and is spaced apart from the light-emitting areas. The color conversion layer is disposed opposite to the first side surface of the substrate and includes the color conversion areas arranged in parallel and disposed corresponding to the light-emitting areas. The second positioning structure is disposed on the side of the color conversion layer facing the first side surface. The second positioning structure is disposed corresponding to the first positioning structure and is connected to the first positioning structure. By means of the corresponding connection between the first positioning structure and the second positioning structure, when the color conversion layer is attached to the substrate, the color conversion areas on the color conversion layer and the light-emitting areas on the substrate can be correspondingly arranged, thereby preventing optical crosstalk caused by displacement and misalignment of the color conversion areas and the light-emitting areas, thus improving the display effects of the display panel.

BRIEF DESCRIPTION OF DRAWINGS

In order to better illustrate the technical solutions in the embodiments of the present application, the following will briefly introduce the accompanying drawings that need to be used in the description of the embodiments. Apparently, the accompanying drawings in the following description show merely some embodiments of the present invention, and a person skilled in the art may still derive other drawings from these accompanying drawings without creative efforts.

DESCRIPTION OF PREFERRED EMBODIMENTS

Figure 1:
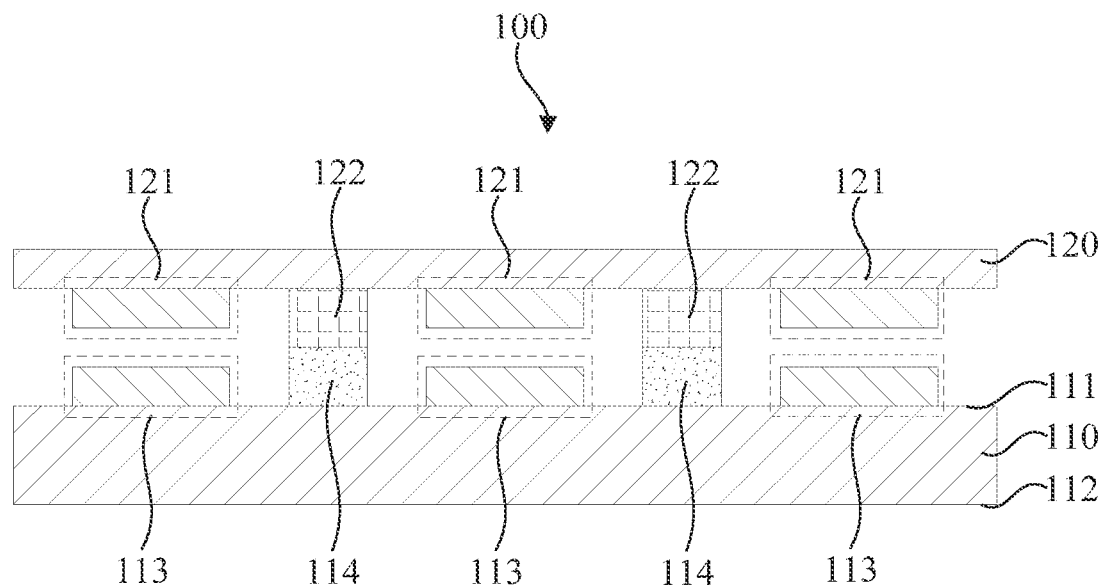
FIG. 1 is a schematic structural view of a display panel according to an embodiment of the present application.

The technical solutions in the embodiments of the present application will be clearly and completely described below in conjunction with the drawings in the embodiments of the present application. Obviously, the described embodiments are only a part of the embodiments of the present application, but not all of the embodiments. Based on the embodiments in this application, all other embodiments obtained by those skilled in the art without creative work shall fall within the protection scope of this application. It should be understood that the specific embodiments described here are only used to illustrate the present application, and are not used to limit the present application. In this application, if no explanation is made to the contrary, the orientation words used, such as "upper" and "lower" usually refer to the upper and lower positions of the device in actual use or working state. Specifically, they refer to the direction of the drawings, and "inner" and "outer" refer to the outline of the device.

Embodiments of the present application provide a display panel and a display device, which will be described in detail below. It should be noted that the description order of the following embodiments is not intended to limit the preferred order of the embodiments.

Embodiments of the present application provides a display panel. As shown in FIGS. 1 to 5, a display panel 100 includes a substrate 110 having a first side surface 111 and a second side surface 112 disposed opposite to each other. A plurality of light-emitting areas 113 are arranged in parallel on the first side surface 111 and are correspondingly provided with a light-emitting light source for the display panel 100. In addition, a circuit structure is formed inside the substrate 110 and is correspondingly connected to the light-emitting light source in the light-emitting areas 113 to control the corresponding light-emitting light source to emit light, thereby regulating a display mode of the display panel 100.

Figure 6:
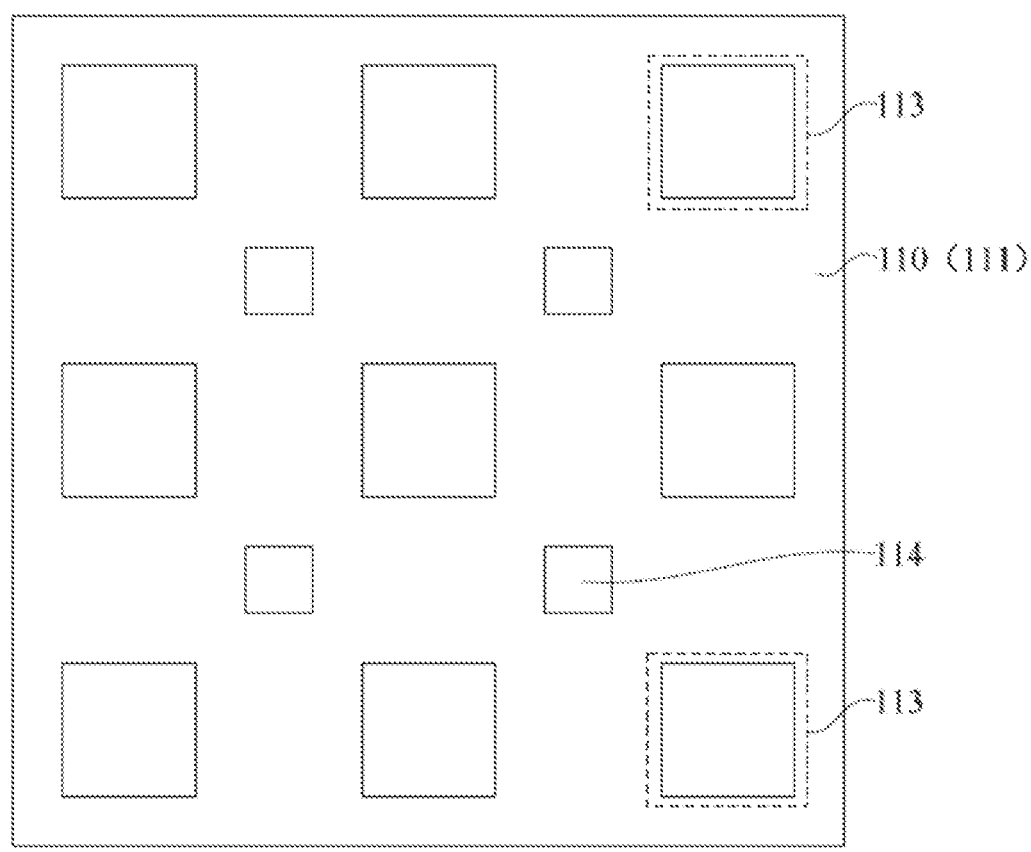
FIG. 6 is a top plan view of a substrate according to an embodiment of the present application.
Figure 7:
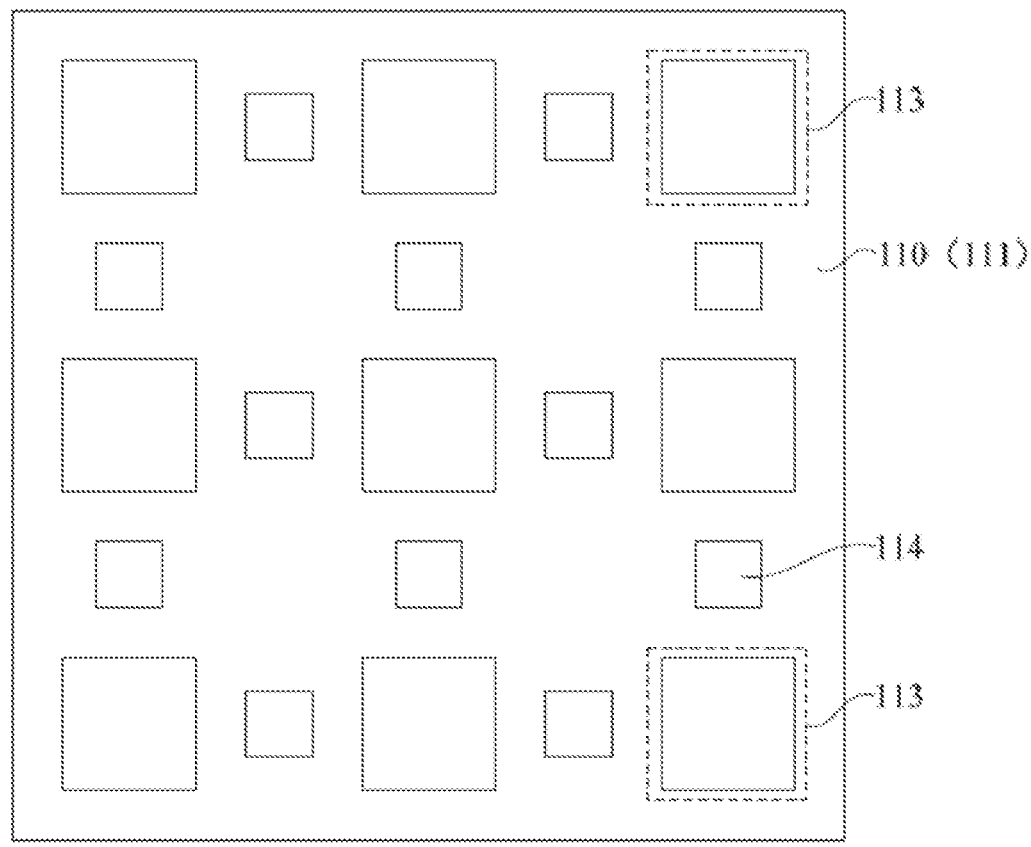
FIG. 7 is a top plan view of another substrate according to an embodiment of the present application.

Specifically, as shown in FIGS. 6 and 7, a plurality of first positioning structures 114 are disposed on a first side surface 111 of the substrate 110 and are spaced apart from the light-emitting areas 113. By forming the first positioning structures 114 on the first side surface 111 of the substrate 110, it facilitates the positioning and connection between the substrate 110 and other functional film layers, thus preventing deviations in connection between other functional film layers and the substrate 110. In addition, the disposition of the first positioning structures 114 spaced apart from the light-emitting areas 113 can prevent the first positioning structures 114 from negatively affecting light-emitting effects of the light-emitting areas 113, which in turn adversely affects display effects of the display panel 100.

Figure 2:
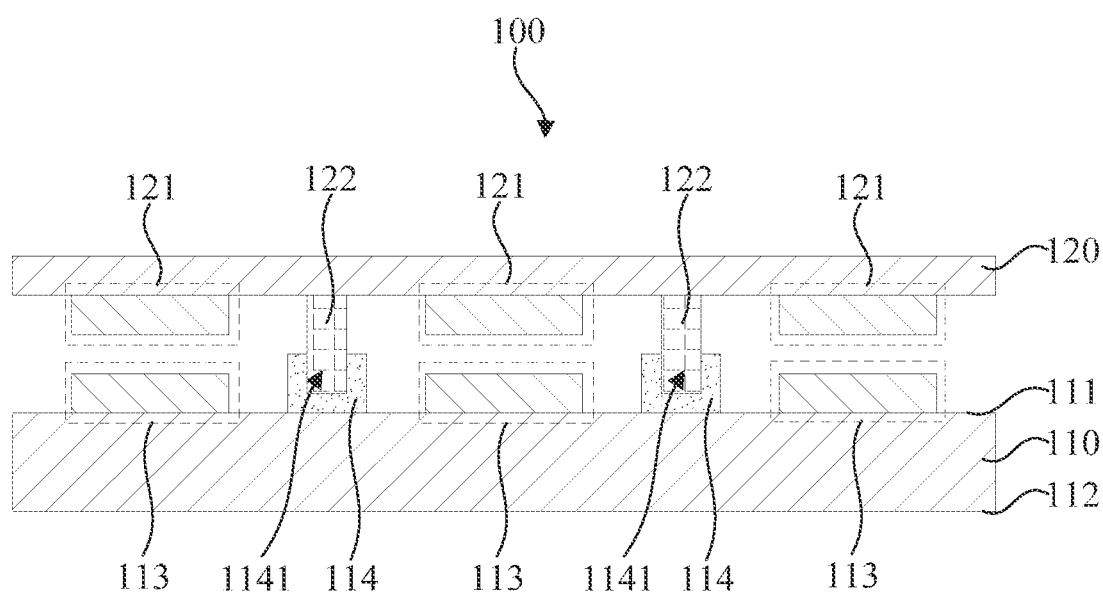
FIG. 2 is a schematic structural view of another display panel according to an embodiment of the present application.
Figure 3:
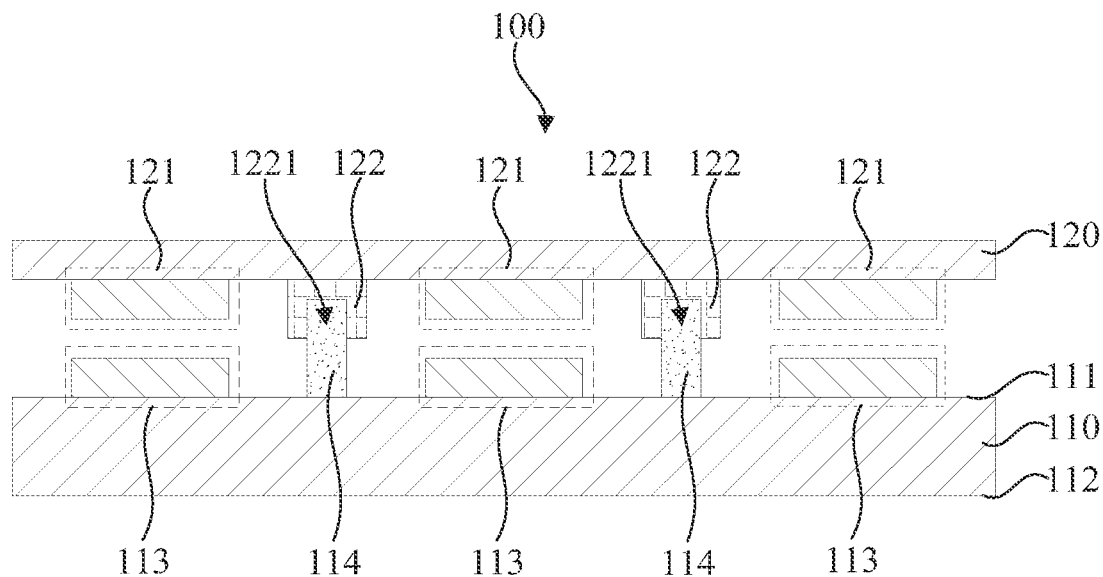
FIG. 3 is a schematic structural view of another display panel according to an embodiment of the present application.

As shown in FIGS. 1 to 3, the display panel 100 includes a color conversion layer 120 disposed opposite to the first side surface 111 of the substrate 110. The color conversion layer 120 includes a plurality of color conversion areas 121 arranged in parallel and disposed corresponding to the light-emitting areas 113. The color conversion layer 120 is mainly configured for color conversion of light emitted by the light-emitting light source in the light-emitting areas 113 on the substrate 110, so that the light emitted by the light-emitting light source passes through the corresponding color conversion area 121 on the color conversion layer 120 and is converted into a target color to achieve different display requirements of the display panel 100.

Specifically, a plurality of second positioning structures 122 are disposed on a side of the color conversion layer 120 facing the first side surface 111 and arranged corresponding to the first positioning structure 114, and the second positioning structure 122 are connected to the first positioning structures 114, respectively. By disposing the second positioning structures 122 on the color conversion layer 120, the second positioning structures 122 can be correspondingly connected to the first positioning structures 114 when the color conversion layer 120 is attached to the substrate 110, so that the color conversion areas 121 and the light-emitting areas 113 are in a one-to-one correspondence, thereby preventing optical crosstalk caused by displacement and misalignment of the color conversion areas 121 and the light-emitting areas 113, which in turn affect the display effects of the display panel 100.

Since the color conversion areas 121 are arranged corresponding to the light-emitting areas 113, the second positioning structures 122 are arranged corresponding to the first positioning structures 114, and the first positioning structures 114 are spaced apart from the light-emitting areas 113, that is, the second positioning structures 122 are also spaced apart from the color conversion areas 121, thus preventing the second positioning structures 122 from negatively affecting light-emitting effects of the light-emitting areas 113, which in turn adversely affects display effects of the display panel 100.

It should be noted that the light-emitting light source corresponding to the light-emitting areas 113 may be a blue light source, and the corresponding color conversion areas 121 on the color conversion layer 120 may include a red conversion area, a green conversion area, and a blue conversion area, so that the light emitted by a blue light source after passing through the color conversion layer 120 is red light, green light, and blue light, respectively.

Specifically, a red conversion area corresponds to a coating of red quantum dots which emit red light when excited by the blue light source. A green conversion area corresponds to a coating of green quantum dots which emit green light when excited by the blue light source. A blue conversion area can be left uncoated, allowing the blue light source to pass directly through the area to form blue light.

It should be noted that the blue conversion area can also be coated with blue quantum dots, and the light-emitting light source can also use other color light sources, which is not limited here. It only needs to ensure that the light-emitting light source of the light-emitting areas 113 can simultaneously form red light, green light, and blue light after passing through the color conversion areas 121 on the color conversion layer 120 to meet different display requirements of the display panel 100.

The display panel 100 in the embodiment of the present application includes the substrate 110 and the color conversion layer 120. The substrate 110 includes opposite first side surface 111 and second side surface 11. A plurality of light-emitting areas 113 are arranged in parallel on the first side surface 111 and a first positioning structure 114 is disposed on the first side surface 111. The first positioning structure 114 is spaced apart from the light-emitting areas 113. The color conversion layer 120 is disposed opposite to the first side surface 111 of the substrate 110 and includes a plurality of color conversion areas 121 arranged in parallel and disposed corresponding to the light-emitting areas 113. A second positioning structure 122 is disposed on a side of the color conversion layer 120 facing the first side surface 111. The second positioning structure 122 is disposed corresponding to the first positioning structure 114 and is connected to the first positioning structure 114. By means of the corresponding connection between the first positioning structure 114 and the second positioning structure 122, the color conversion areas 121 on the color conversion layer and the light-emitting areas 113 on the substrate 110 can be correspondingly arranged, thereby preventing optical crosstalk caused by displacement and misalignment of the color conversion areas 121 and the light-emitting areas 113, which in turn affect the display effects of the display panel 100.

Optionally, as shown in FIGS. 1 to 3, the first positioning structure 114 is protruded on the first side surface 111, the second positioning structure 122 is protruded on the side of the color conversion layer 120 facing the first side surface 111, and a side of the first positioning structure 114 facing the second positioning structure 122 is connected to a side of the second positioning structure 122 facing the first positioning structure 114. That is, the first positioning structure 114 and the second positioning structure 122 are convex in shape. The first positioning structure 114 and the second positioning structure 122 not only can play a positioning role in aligning the light-emitting areas 113 with the color conversion areas 121 in a one-to-one correspondence, but also can play a supporting role for the substrate 110 and the color conversion layer 120. By designing thicknesses of the first positioning structure 114 and the second positioning structure 122, a size of a gap between the light-emitting area 113 and the corresponding color conversion area 121 can be adjusted, thus achieving adjustment of light-emitting angles of the display panel 100.

In some embodiments, as shown in FIG. 2, a first positioning hole 1141 is located on the side of the first positioning structure 114 facing the second positioning structure 122, and the second positioning structure 122 is inserted into the first positioning hole 1141, so that the second positioning structure 122 is connected to the first positioning structure 114. By forming the first positioning hole 1141 in the first positioning structure 114, a position of the second positioning structure 122 relative to the first positioning structure 114 after the second positioning structure 122 is inserted into the first positioning hole 1141 is more stable, thereby preventing left-right displacement between the first positioning structure 114 and the second positioning structure 122 from being occurred due to their relative moving during production or use of the display panel 100, so that a risk of crosstalk occurring after the light emitted by the light-emitting areas 113 passes through the color conversion areas 121 is reduced, thus improving the display effects of the display panel 100.

Specifically, an end of the second positioning structure 122 facing the first positioning structure 114 can be directly inserted into the first positioning hole 1141, that is, an orthographic projection of the second positioning structure 122 on the first side surface 111 falls within an orthographic projection of the first positioning structure 114 on the first side surface 111. Alternatively, the side of the second positioning structure 122 facing the first positioning structure 114 is protruded with a first positioning portion, and the first positioning portion is inserted into the first positioning hole 1141, so that the orthographic projection of the second positioning structure 122 on the first side surface 111 coincides with the orthographic projection of the first positioning structure 114 on the first side surface 111, which is conducive to the corresponding arrangement of the color conversion areas 121 and the light-emitting areas 113, and the influence of the first positioning structure 114 and the second positioning structure 122 on the light-emitting effects of the light-emitting areas 113 is prevented.

In other embodiments, as shown in FIG. 3, a second positioning hole 1221 is located on the side of the second positioning structure 114 facing the first positioning structure 114, and the first positioning structure 114 is inserted into the second positioning hole 1221, so that the first positioning structure 114 is connected to the second positioning structure 122. By forming the second positioning hole 1221 in the second positioning structure 122, a position of the first positioning structure 114 relative to the second positioning structure 122 after the first positioning structure 114 is inserted into the second positioning hole 1221 is more stable, thereby preventing left-right displacement of the first positioning structure 114 and the second positioning structure 122 from being occurred due to their relative moving during production or use of the display panel 100, so that a risk of crosstalk occurring after the light emitted by the light-emitting areas 113 passes through the color conversion areas 121 is reduced, thus improving the display effects of the display panel 100.

Specifically, an end of the first positioning structure 114 facing the second positioning structure 122 can be directly inserted into the second positioning hole 1221, that is, the orthographic projection of the first positioning structure 114 on the first side surface 111 falls within the orthographic projection of the second positioning structure 122 on the first side surface 111. Alternatively, the side of the first positioning structure 114 facing the second positioning structure 122 is protruded with a second positioning portion, and the second positioning portion is inserted into the second positioning hole 1221, so that the orthographic projection of the first positioning structure 114 on the first side surface 111 coincides with the orthographic projection of the second positioning structure 122 on the first side surface 111, which is conducive to the corresponding arrangement of the color conversion areas 121 and the light-emitting areas 113, and the influence of the first positioning structure 114 and the second positioning structure 122 on the light-emitting effect of the light-emitting area 113 is prevented.

In still other embodiments, a first positioning hole 1141 is formed on the side of the first positioning structure 114 facing the second positioning structure 122, and the side of the second positioning structure 122 facing the first positioning structure 114 is protruded with a first positioning portion. In this case, the side of the second positioning structure 122 facing the first positioning structure 114 is provided with a second positioning hole 1221, and the side of the first positioning structure 114 facing the second positioning structure 122 is protruded with a second positioning portion. The first positioning portion is inserted into the first positioning hole 1141, and the second positioning portion is inserted into the second positioning hole 1221, so that the first positioning structure 114 and the second positioning structure 122 are connected.

Such a structural design enables the first positioning structure 114 and the second positioning structure 122 to be engaged with each other, which helps to improve stability of the relative positioning of the first positioning structure 114 and the second positioning structure 122, so that the misalignment of the light-emitting areas 113 and the color conversion areas 121 during the production or use of the display panel 100 is prevented, thereby reducing a risk of crosstalk occurring after the light emitted by the light-emitting areas 113 passes through the color conversion areas 121, and improving the display effects of the display panel 100.

Figure 4:
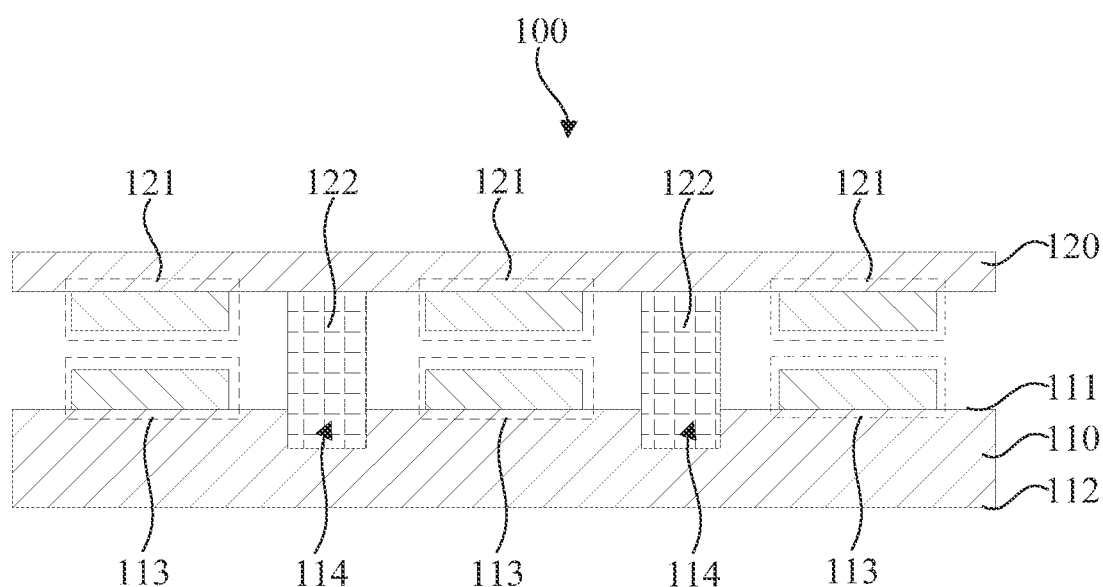
FIG. 4 is a schematic structural view of another display panel according to an embodiment of the present application.

Optionally, as shown in FIG. 4, the first side surface 111 of the substrate 110 is partially recessed to form the first positioning structure 114, and the second positioning structure 122 is protruded on the side of the color conversion layer 120 facing the first side surface 111. The second positioning structure 122 is inserted into the first positioning structure 114 to connect the second positioning structure 122 to the first positioning structure 114. That is, the first positioning structure 114 is a positioning groove located on the first side surface 111 of the substrate 110, and the second positioning structure 122 is a positioning portion protruding on the color conversion layer 120. The positioning connection between the substrate 110 and the color conversion layer 120 is achieved by mutual cooperation between the positioning portion and the positioning groove, and at the same time, the misalignment of the light-emitting areas 113 and the color conversion areas 121 during the production or use of the display panel 100 can be prevented, thereby reducing the risk of crosstalk occurring after the light emitted by the light-emitting areas 113 passes through the color conversion areas 121, and improving the display effects of the display panel 100.

Figure 5:
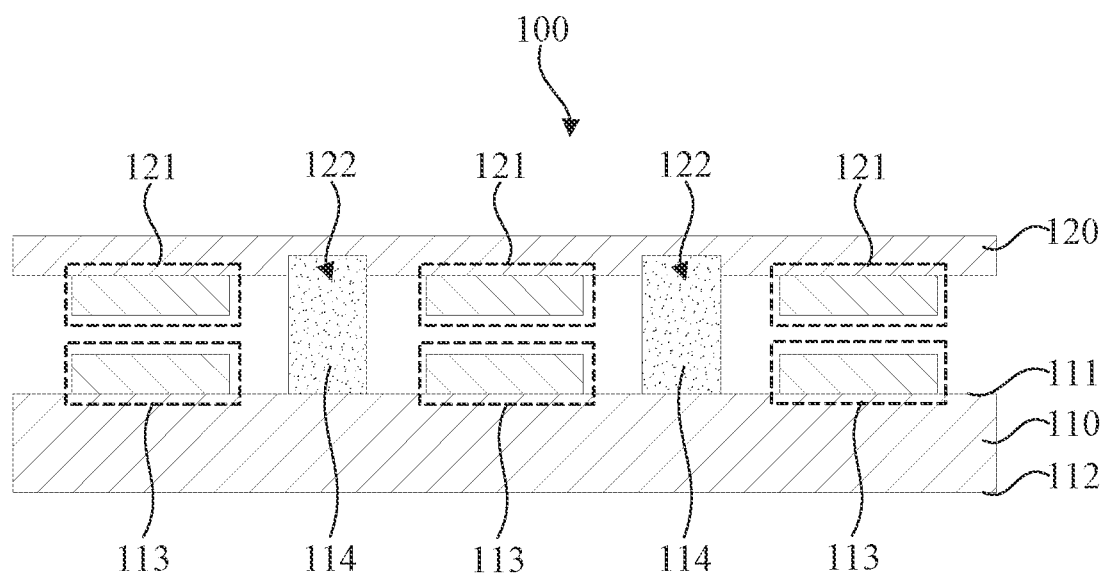
FIG. 5 is a schematic structural view of another display panel according to an embodiment of the present application.

In some embodiments, as shown in FIG. 5, the side of the color conversion layer 120 facing the first side surface 111 is partially recessed to form the second positioning structure 122, and the first positioning structure 114 is protruded on the first side surface 111. The first positioning structure 114 is inserted into the second positioning structure 122 to connect the first positioning structure 114 to the second positioning structure 122. That is, the second positioning structure 122 is a positioning groove located on the color conversion layer 120, and the first positioning structure 114 is a positioning portion protruding on the first side surface 111 of the substrate 110. The positioning connection between the substrate 110 and the color conversion layer 120 is achieved by the mutual cooperation between the positioning portion and the positioning groove, and at the same time, the misalignment of the light-emitting areas 113 and the color conversion areas 121 during the production or use of the display panel 100 can be prevented, thereby reducing the risk of crosstalk occurring after the light emitted by the light-emitting areas 113 passes through the color conversion areas 121, and improving the display effects of the display panel 100.

In other embodiments, a positioning groove and a positioning portion are formed on the first side surface 111 of the substrate 110 to form the first positioning structure 114. The side of the color conversion layer 120 facing the first side surface 111 is also provided with a positioning groove and a positioning portion to form the second positioning structure 122. In connection, the positioning portion in the first positioning structure 114 is inserted into the positioning groove in the second positioning structure 122, and the positioning portion in the second positioning structure 122 is inserted into the positioning groove in the first positioning structure 114, so that the first positioning structure 114 and the second positioning structure 122 can be engaged together, which helps to improve the stability of the relative positions of the first positioning structure 114 and the second positioning structure 122, and the misalignment of the light-emitting areas 113 and the color conversion areas 121 during the production or use of the display panel 100 is prevented, thereby reducing the risk of crosstalk occurring after the light emitted by the light-emitting areas 113 passes through the color conversion areas 121, and improving the display effects of the display panel 100.

Optionally, the first positioning structure 114 is located between adjacent two of the light-emitting areas 113, and the second positioning structure 122 is located between adjacent two of the color conversion areas 121. Since the first positioning structure 114 and the second positioning structure 122 are disposed correspondingly, the first positioning structure 114 is disposed between adjacent ones of the light-emitting areas 113, and the second positioning structure 122 is arranged between adjacent ones of the color conversion areas 121, it ensures that the relative arrangement between the light-emitting areas 113 and the color conversion areas 121 when the first positioning structure 114 is connected to the second positioning structure 122, thereby reducing the risk of misalignment of the light-emitting areas 113 and the color conversion areas 121 during the production of the display panel 100.

In some embodiments, a first positioning structure 114 is disposed between any two adjacent light-emitting areas 113, a second positioning structure 122 is disposed between any two adjacent color conversion areas 121, and the first positioning structures 114 are connected to the second positioning structures 122 in a one-to-one correspondence. By means of the first positioning structure 114 arranged between any two adjacent light-emitting areas 113, the second positioning structure 122 arranged between any two adjacent color conversion areas 121, any one of the light-emitting areas 113 and a corresponding one of the color conversion areas 121 can be positioned in place through the corresponding first positioning structure 114 and the second positioning structure 122, thereby further helping reduce the risk of misalignment of the light-emitting areas 113 and the color conversion areas 121 during the production of the display panel 100.

It should be noted that the setting positions and setting methods of the first positioning structure 114 and the second positioning structure 122 can be adjusted correspondingly according to actual production and use conditions, it only needs to ensure that the arrangement of the first positioning structure 114 and the second positioning structure 122 can prevent the misalignment of the light-emitting areas 113 and the color conversion areas 121 during the production or use of the display panel 100, which is not specifically limited here.

Optionally, materials used for the first positioning structure 114 and the second positioning structure 122 in the embodiment of the present application are thermoplastic. That is, during a manufacturing process of the display panel 100, when the first positioning structure 114 is protruded on the first side surface 111 of the substrate 110 and the second positioning structure 122 is protruded on the side of the color conversion layer 120 facing the first side 111, the first positioning structure 114 and the second positioning structure 122 can be melted by heating, and then integrated by cooling, so as to realize the connection between the first positioning structure 114 and the second positioning structure 122.

Specifically, when the side of the first positioning structure 114 facing the second positioning structure 122 is provided with the first positioning hole 1141 and the second positioning structure 122 is inserted into the first positioning hole 1141, or when the side of the second positioning structure 122 facing the first positioning structure 114 is provided with the second positioning hole 1221 and the first positioning structure 114 is inserted into the second positioning hole 1221, or when the side of the first positioning structure 114 facing the second positioning structure 122 is provided with the first positioning hole 1141, the side of the second positioning structure 122 facing the first positioning structure 114 is protruded with the first positioning portion, the side of the second positioning structure 122 facing the first positioning structure 114 is provided with the second positioning hole 1221, and the side of the first positioning structure 114 facing the second positioning structure 122 is protruded with the second positioning portion, and when the first positioning portion is inserted into the first positioning hole 1141 and the second positioning portion is inserted into the second positioning hole 1221, since the first positioning structure 114 and the second positioning structure 122 are in engagement with each other, when the first positioning structure 114 and the second positioning structure 122 are heated, it is more favorable for integration of the first positioning structure 114 and the second positioning structure 122, thereby improving the stability of the relative position of the first positioning structure 114 and the second positioning structure 122.

Optionally, materials used for the first positioning structure 114 and the second positioning structure 122 in the embodiment of the present application include magnetic materials. The side of the first positioning structure 114 facing the second positioning structure 122 and the side of the second positioning structure 122 facing the first positioning structure 114 magnetically attract each other. That is, the first positioning structure 114 and the second positioning structure 122 are made of magnetic materials. When the color conversion layer 120 is connected to the substrate 110, the connection between the first positioning structure 114 and the second positioning structure 122 can be achieved by mutual attraction between the first positioning structure 114 and the second positioning structure 122. Such an arrangement makes the connection between the first positioning structure 114 and the second positioning structure 122 more flexible and convenient, which is helpful for simplifying the manufacturing process of the display panel 100.

Specifically, the materials used for the first positioning structure 114 and the second positioning structure 122 may be magnetic materials, such as permanent magnets, and the specific material types can be selected according to design requirements, and no special limitation is made here. It is only necessary to ensure the effective attraction of the first positioning structure 114 and the second positioning structure 122.

Optionally, materials used for the first positioning structure 114 and the second positioning structure 122 in the embodiment of the present application include light-shielding materials. That is, when in a positioning process in a corresponding one of the light-emitting areas 113 and a corresponding one of the color conversion areas 121, the first positioning structure 114 and the second positioning structure 122 can further block the light emitted by the light-emitting light sources in adjacent ones of the light-emitting areas 113 to further prevent optical crosstalk between the adjacent ones of the light-emitting areas 113, thus improving the display effects of the display panel 100.

Specifically, there are positioning structures 114 arranged around the corresponding light-emitting areas 113, and there are second positioning structures 122 arranged around the corresponding color conversion area 121. That is, the first positioning structures 114 are located between and shield any two adjacent light-emitting areas 113, and the second positioning structures 122 are located between and shield any adjacent two color conversion areas 121. The first positioning structure 114 is connected to the second positioning structure 122 so as to shield the two adjacent light-emitting areas 113, and prevent the crosstalk between light emitted by the light-emitting light sources in the two adjacent light-emitting areas 113, thereby improving the display effects of the display panel 100.

It should be noted that in addition to the methods of connecting the first positioning structure 114 to the second positioning structure 122 through heating and melting and then cooling for fusion, or magnetic attraction in the embodiments of the present application, it is also possible to apply an adhesive layer directly on each of the side of the first positioning structure 114 facing the second positioning structure 122 and the side of the second positioning structure 122 facing the first positioning structure 114, so that the connection between the first positioning structure 114 and the second positioning structure 122 is achieved through bonding between the adhesive layers.

In addition, the first positioning structure 114 and the second positioning structure 122 can also be directly connected by vacuum adsorption. Specifically, the specific connection method of the first positioning structure 114 and the second positioning structure 122 can be selected according to the actual design requirements, and no special limitation is made here. It only needs to ensure that the first positioning structure 114 and the second positioning structure 122 can be effectively connected to prevent the misalignment of the light-emitting areas 113 and the corresponding color conversion areas 121 during the production or use of the display panel 100.

In addition, an embodiment of the present application further provides a display device, including a display panel.

A specific structure of the display panel refers to the above-mentioned embodiments. Since the display device adopts all the technical solutions of the above-mentioned embodiments, the display device has at least all the beneficial effects brought by the technical solutions of the above-mentioned embodiments, which will not be repeated here.

Figure 8:
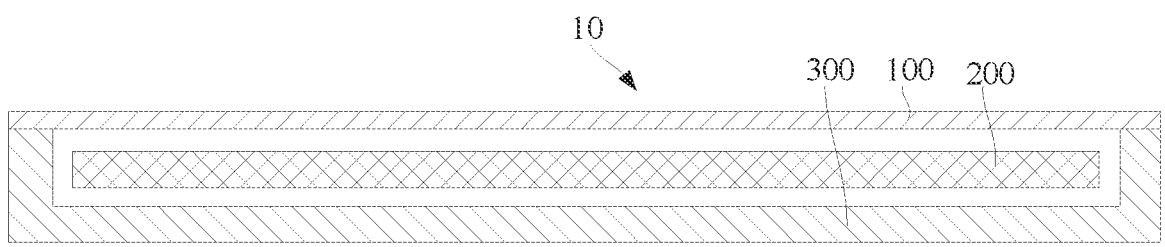
FIG. 8 is a schematic structural view of a display device according to an embodiment of the present application.

As shown in FIG. 8, the display device 10 includes a display panel 100, a control circuit 200, and a casing 300. Specifically, the casing 300 is connected with the display panel 100 to support and fix the display panel 100. The control circuit 200 is disposed in the casing 300 and is electrically connected to the display panel 100 to control the display panel 100 to display images.

Specifically, the display panel 100 may be fixed to the casing 300 to form an integral body with the casing 300. The display panel 100 and the casing 300 form a closed space for accommodating the control circuit 200. The control circuit 200 can be the main board of the display device 10. In addition, the control circuit 200 may also be integrated with one or more functional components, such as a battery, an antenna structure, a microphone, a speaker, a headphone interface, a universal serial bus interface, a camera, a distance sensor, an ambient light sensor, and a processor, etc., so that the display device 10 can be used in various application fields.

It should be noted that the display device 10 is not limited to the above contents, and may also include other devices, such as cameras, antenna structures, fingerprint unlocking modules, etc., to expand its use range, which is not limited here.

The display device 10 in the embodiment of the present application has a wide range of applications, including televisions, computers, mobile phones, and flexible displays and lighting, such as foldable and rollable displays, and wearable devices, such as smart bracelets, smart watches, etc., all fall within the scope of the application field of the display device 10 in the embodiments of the present application.

The display panel and the display device provided in the embodiments of the present application are described in detail above. Specific examples are used in this article to illustrate the principles and implementation of the application, and the descriptions of the above examples are only used to help understand the methods and core ideas of the application; in addition, for those skilled in the art, according to the idea of the application, there will be changes in the specific implementation and the scope of application. In summary, the content of this specification should not be construed as a limitation of the application.

What is claimed is:

1. A display panel, comprising:
    a substrate comprising a first side surface and a second side surface disposed opposite to each other, wherein a plurality of light-emitting areas are arranged in parallel on the first side surface, and a first positioning structure is disposed on the first side surface and is spaced apart from the light-emitting areas; and
    a color conversion layer disposed opposite to the first side surface of the substrate and comprising a plurality of color conversion areas arranged in parallel and disposed corresponding to the light-emitting areas, wherein a second positioning structure is disposed on a side of the color conversion layer facing the first side surface and arranged corresponding to the first positioning structure, and the second positioning structure is connected to the first positioning structure,
    wherein the first side surface of the substrate is partially recessed for formation of the first positioning structure, and the second positioning structure is protruded on the side of the color conversion layer facing the first side surface and is inserted into the first positioning structure, so that the second positioning structure is connected to the first positioning structure; or the side of the color conversion layer facing the first side surface is recessed for formation of the second positioning structure, and the first positioning structure is protruded on the first side surface and is inserted into the second positioning structure, so that the first positioning structure is connected to the second positioning structure.

2. The display panel of claim 1, wherein the first positioning structure is protruded on the first side surface, the second positioning structure is protruded on the side of the color conversion layer facing the first side surface, and a side of the first positioning structure facing the second positioning structure is connected to a side of the second positioning structure facing the first positioning structure.

3. The display panel of claim 2, wherein a first positioning hole is located on the side of the first positioning structure facing the second positioning structure, and the second positioning structure is inserted into the first positioning hole, so that the second positioning structure is connected to the first positioning structure; and/or,
    a second positioning hole is located on the side of the second positioning structure facing the first positioning structure, and the first positioning structure is inserted into the second positioning hole, so that the first positioning structure is connected to the second positioning structure.

4. The display panel of claim 2, wherein each of the first positioning structure and the second positioning structure is made of a thermoplastic material.

5. The display panel of claim 2, wherein each of the first positioning structure and the second positioning structure is made of a material comprising a magnetic material, and the side of the first positioning structure facing the second positioning structure and the side of the second positioning structure facing the first positioning structure magnetically attract each other.

6. The display panel of claim 2, wherein each of the first positioning structure and the second positioning structure is made of a material comprising a light-shielding material, a first positioning structure is disposed between any two adjacent ones of the light-emitting areas, and a second positioning structure is disposed between any two adjacent ones of the color conversion areas.

7. The display panel of claim 1, wherein the first positioning structure is located between adjacent ones of the light-emitting areas, and the second positioning structure is located between adjacent ones of the color conversion areas.

8. The display panel of claim 7, wherein a first positioning structure is disposed between any two adjacent ones of the light-emitting areas, and a second positioning structure is disposed between any two adjacent ones of the color conversion areas.

9. A display device, comprising:
    the display panel of claim 1;
    a casing connected to the display panel; and
    a control circuit disposed in the casing and electrically connected to the display panel.

10. The display panel of claim 1, wherein the first positioning structure is provided with a positioning groove and a positioning portion on the first side surface, and the second positioning structure is provided with a positioning groove and a positioning portion on the side of the color conversion layer facing the first side surface; and in response to the second positioning structure being connected to the first positioning structure, the positioning portion of the first positioning structure is inserted into the positioning groove of the second positioning structure, and the positioning portion of the second positioning structure is inserted into the positioning groove of the first positioning structure.

11. The display panel of claim 1, wherein the first positioning structure and the second positioning structure are directly connected with each other by vacuum adsorption.

\* \* \* \* \*